(12) United States Patent
Li et al.

(10) Patent No.: US 11,392,030 B2
(45) Date of Patent: Jul. 19, 2022

(54) PHOTORESIST COMPOSITION AND MANUFACTURING METHOD THEREOF, OLED ARRAY SUBSTRATE AND MANUFACTURING METHOD THEREOF

(71) Applicant: BOE TECHNOLOGY GROUP CO., LTD., Beijing (CN)

(72) Inventors: Wei Li, Beijing (CN); Xing Zhang, Beijing (CN); Dini Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1029 days.

(21) Appl. No.: 16/072,728

(22) PCT Filed: Dec. 13, 2017

(86) PCT No.: PCT/CN2017/115958
§ 371 (c)(1),
(2) Date: Jul. 25, 2018

(87) PCT Pub. No.: WO2018/205601
PCT Pub. Date: Nov. 15, 2018

(65) Prior Publication Data
US 2021/0208502 A1 Jul. 8, 2021

(30) Foreign Application Priority Data
May 12, 2017 (CN) .......................... 201710335687.8

(51) Int. Cl.
*G03F 7/004* (2006.01)
*G03F 7/075* (2006.01)
(Continued)

(52) U.S. Cl.
CPC .......... *G03F 7/0043* (2013.01); *G03F 7/0757* (2013.01); *H01L 27/3246* (2013.01); *H01L 51/56* (2013.01)

(58) Field of Classification Search
CPC .... G03F 7/0043; G03F 7/0046; G03F 7/0757; G03F 7/105; C08L 83/04
See application file for complete search history.

(56) References Cited

U.S. PATENT DOCUMENTS 5,252,766 A * 10/1993 Sakakura ................ C08G 77/60
556/430
8,946,712 B2 * 2/2015 Yang ....................... H01L 27/12
438/149
(Continued)

FOREIGN PATENT DOCUMENTS

CN 101126902 A 2/2008
CN 101216670 A 7/2008
(Continued)

OTHER PUBLICATIONS

Chinese Office Action in Chinese Application No. 201710335687.8, dated Apr. 1, 2019 with English translation.
(Continued)

*Primary Examiner* — Amanda C. Walke
(74) *Attorney, Agent, or Firm* — Collard & Roe, P.C.

(57) ABSTRACT

A photoresist composition, an organic light-emitting diode array substrate and their manufacturing methods are provided. The photoresist composition includes: an alkali soluble resin, a photosensitive monomer, a thermochromic pigment and a solvent whose mass percentages are 10-30 wt %, 1-12 wt %, 5-20 wt %, and 40-65 wt %, respectively; and the thermochromic pigment has a darkened color upon being heated.

20 Claims, 3 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 9,746,380 B2* | 8/2017 | Ribi | .................... A47G 21/182 |
| 2008/0179572 A1 | 7/2008 | Kim et al. | |
| 2009/0047599 A1 | 2/2009 | Horne et al. | |
| 2010/0140621 A1* | 6/2010 | Yang | ................ H01L 29/78633 |
| | | | 257/59 |
| 2012/0322182 A1* | 12/2012 | Yang | ....................... H01L 27/12 |
| | | | 438/29 |
| 2015/0370165 A1 | 12/2015 | Wang | |
| 2016/0060449 A1* | 3/2016 | Shulga | ................. B29C 64/106 |
| | | | 522/179 |
| 2017/0066931 A1* | 3/2017 | Ribi | ........................... C08J 3/22 |
| 2019/0142713 A1* | 5/2019 | Ribi | ........................ A61Q 1/02 |
| | | | 424/59 |

FOREIGN PATENT DOCUMENTS

| | | |
|---|---|---|
| CN | 101315520 A | 12/2008 |
| CN | 101324753 A | 12/2008 |
| CN | 102654731 A | 9/2012 |
| CN | 103792789 A | 5/2014 |
| CN | 105301907 A | 2/2016 |
| CN | 105378309 A | 3/2016 |
| CN | 107024835 A | 8/2017 |

OTHER PUBLICATIONS

International Search Report of PCT/CN2017/115958 in Chinese, dated Mar. 12, 2018 with English translation.
Notice of Transmittal of the International Search Report of PCT/CN2017/115958 in Chinese, dated Mar. 12, 2018.
Written Opinion of the International Searching Authority of PCT/CN2017/115958 in Chinese, dated Mar. 12, 2018 with English translation.

* cited by examiner

PHOTORESIST COMPOSITION AND MANUFACTURING METHOD THEREOF, OLED ARRAY SUBSTRATE AND MANUFACTURING METHOD THEREOF

CROSS REFERENCE TO RELATED APPLICATIONS

This application is the National Stage of PCT/CN2017/115958 filed on Dec. 13, 2017, which claims priority under 35 U.S.C. § 119 of Chinese Application No. 201710335687.8 filed on May 12, 2017, the disclosure of which is incorporated by reference.

The present application claims the priority of the Chinese Patent Application No. 201710335687.8 filed on May 12, 2017, which is incorporated herein by reference as part of the disclosure of the present application.

TECHNICAL FIELD

Embodiments of the present disclosure relate to a photoresist composition, a manufacturing method of the photoresist composition, an organic light-emitting diode (OLED) array substrate and a manufacturing method of the organic light-emitting diode (OLED) array substrate.

BACKGROUND

Organic light-emitting diode (OLED) is an organic thin film light-emitting device, which has advantages of a simple manufacturing process, a low cost, a high light-emitting efficiency and being easy to form a flexible structure. Therefore, a display technology using the organic light-emitting diode (OLED) has become an important display technology.

In general, the pixel definition layer in the organic electroluminescent diode is made from a photoresist. The photoresist can be divided into a positive photoresist and a negative photoresist. With the rapid development of the large-scale integrated circuit industry, and diversifications of products and varieties of the integrated circuits, the requirements on the properties of photoresist are becoming higher and higher, for example, a higher resolution of the photoresist and thus a higher alignment accuracy of the photoresist are desired.

SUMMARY

At least one embodiment of the present disclosure provides a photoresist composition, and the photoresist composition comprises: an alkali soluble resin, a photosensitive monomer, a thermochromic pigment and a solvent, whose mass percentages are from about 10 wt % to about 30 wt %, from about 1 wt % to about 12 wt %, from about 5 wt % to about 20 wt %, and from about 40 wt % to about 65 wt %, respectively; and the thermochromic pigment has a darkened color upon being heated.

For example, a photoresist composition provided by at least one embodiment of the present disclosure further comprises a fluorinated organosilicon photosensitive resin, wherein a mass percentage of the fluorinated organosilicon photosensitive resin is from about 5 wt % to about 10 wt %, the mass percentage of the alkali soluble resin is from about 10 wt % to about 25 wt %, the mass percentage of the photosensitive monomer is from about 1 wt % to about 10 wt %, the mass percentage of the thermochromic pigment is from about 5 wt % to about 20 wt %, and the mass percentage of the solvent is from about 40 wt % to about 63 wt %.

For example, in a photoresist composition provided by at least one embodiment of the present disclosure, the fluorinated organosilicon photosensitive resin comprises at least one of a fluorinated organosilicon photosensitive resin with a silsesquioxane cage structure and a fluorinated organosilicon photosensitive resin with a linear fluorinated organosilicon structure.

For example, in a photoresist composition provided by at least one embodiment of the present disclosure, the thermochromic pigment comprises: at least one of $(NH_4)_3PO_4 \cdot 12MoO_3$, $[Cr(NH_3)_6]_4(P_2O_7)_3$, $Co(NH_3)_5Cl_3$, a crystal violet lactone containing triarylmethane and derivatives of the crystal violet lactone containing triarylmethane.

For example, in a photoresist composition provided by at least one embodiment of the present disclosure, the thermochromic pigment has a darkened color upon being heated at about 190° C. to about 230° C.

For example, in a photoresist composition provided by at least one embodiment of the present disclosure, the alkali soluble resin comprises at least one of an acrylic alkali soluble resin and a polyimide alkali soluble resin.

For example, in a photoresist composition provided by at least one embodiment of the present disclosure, the photosensitive monomer comprises a diazonaphthoquinone-based photosensitive monomer.

For example, in a photoresist composition provided by at least one embodiment of the present disclosure, the solvent comprises at least one of fatty alcohol, ethylene glycol monomethyl ether, ethylene glycol monoethyl ether, ethylene glycol mono propyl ether, ethylene glycol mono butyl ether, methyl ethyl ketone, methyl isobutyl ketone, γ-butyrolactone, butyldiglycol, butyldiglycol acetate, propylene glycol monomethyl ether, propylene glycol monomethyl ether acetate, cyclohexane, xylene and isopropanol.

For example, a photoresist composition provided by at least one embodiment of the present disclosure further comprises a photoinitiator, and the photoinitiator comprises at least one of a diimidazole compound, a benzoin compound, a polynuclear quinone compound, a diphenyl ketone compound, an acetophenone compound, a triazine compound, a diazo compound, an anthrone compound, a xanthone compound, an oxime ester, an iodonium salt, and a sulfonium salt.

For example, a photoresist composition provided by at least one embodiment of the present disclosure further comprises a dispersant, and the dispersant comprises a lignosulfonate.

For example, a photoresist composition provided by at least one embodiment of the present disclosure further comprises at least one of a coupling agent, an antioxidant, an ultraviolet absorber and a defoamer.

At least one embodiment of the present disclosure further provides an organic light-emitting diode (OLED) array substrate comprising a pixel definition layer, and the pixel definition layer is made from any one of the photoresist compositions described above.

At least one embodiment of the present disclosure further provides a manufacturing method of a photoresist composition, and the manufacturing method comprises: adding an alkali soluble resin, a photosensitive monomer and a thermochromic pigment in turn in a solvent to form the photoresist composition, wherein a mass percentage of the alkali soluble resin is from about 10 wt % to about 30 wt %, a mass percentage of the photosensitive monomer is from about 1 wt % to about 12 wt %, a mass percentage of the thermochromic pigment is from about 5 wt % to about 20 wt %, and a mass percentage of the solvent is from about 40 wt % to about 65 wt %; and the thermochromic pigment has a darkened color upon being heated.

For example, in a manufacturing method of a photoresist composition provided by at least one embodiment of the present disclosure, the manufacturing method further comprises: adding a fluorinated organosilicon photosensitive resin to the solvent before adding the thermochromic pigment, wherein a mass percentage of the fluorinated organosilicon photosensitive resin is from about 5 wt % to about 10 wt %, the mass percentage of the alkali soluble resin is from about 10 wt % to about 25 wt %, the mass percentage of the photosensitive monomer is from about 1 wt % to about 10 wt %, the mass percentage of the thermochromic pigment is from about 5 wt % to about 20 wt %, and the mass percentage of the solvent is from about 40 wt % to about 63 wt %.

At least one embodiment of the present disclosure further provides a manufacturing method of an organic light-emitting diode (OLED) array substrate, and the manufacturing method comprises: providing a base substrate; forming a film of any one of the above mentioned photoresist compositions on the base substrate; patterning the film of the photoresist composition to form a pixel definition layer pattern; and heating the pixel definition layer pattern to darken its color.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

DETAILED DESCRIPTION

Figure 1:
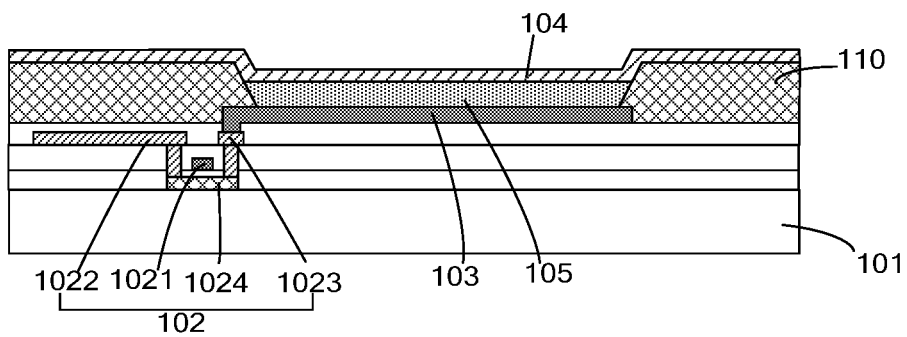
FIG. 1 is a schematic diagram of a sectional structure of an organic light-emitting diode (OLED) array substrate provided by an embodiment of the present disclosure.

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

In a case that the color of a pixel definition layer in an organic light-emitting display device is dark, such as black, the white light emitted by a light-emitting layer and the light reflected by a metal are prevented from irradiating onto an active layer of a driving transistor to avoid adverse effect on the driving transistor, and light leakage, color mixing and other adverse phenomena are also prevented. In general, the material of the pixel definition layer with a shading property is a negative photoresist. Compared with a positive photoresist, the negative photoresist has a lower resolution, and has an insufficient alignment accuracy during forming a pattern of the pixel definition layer. In addition, if the shading capacity of the pixel definition layer is too strong, there is a problem of being unable to align.

At least one embodiment of the present disclosure provides a photoresist composition for manufacturing a pixel definition layer of an organic light-emitting display device (OLED). For example, during forming the pixel definition layer by the photoresist composition, a pixel definition layer film allows the light to pass through before a post-baking process, so as to facilitate the exposure alignment. The subsequent post-baking process after forming a pattern of the pixel definition layer makes the thermochromic pigment in the pixel definition layer undergo an irreversible color change, and the color of the pixel definition layer is darkened to achieve a shading effect. For example, the photoresist is a positive photoresist, so it has a higher resolution than that of the negative photoresist, which can improve the alignment accuracy.

At least one embodiment of the present disclosure further provides a photoresist composition comprising an alkali soluble resin, a photosensitive monomer, a thermochromic pigment and a solvent, wherein a mass percentage of the alkali soluble resin is from about 10 wt % to about 30 wt %, a mass percentage of the photosensitive monomer is from about 1 wt % to about 12 wt %, a mass percentage of the thermochromic pigment is from about 5 wt % to about 20 wt %, and a mass percentage of the solvent is from about 40 wt % to about 65 wt %; and the thermochromic pigment has a darkened color upon being heated. The photoresist composition can be used in the pixel definition layer of the organic light-emitting display device, which satisfies the requirements on both alignment accuracy and shading ability.

At least one embodiment of the present disclosure provides a photoresist composition comprising a thermochromic pigment, wherein the color of the thermochromic pigment is changed at a certain temperature, and the color of the thermochromic pigment becomes darker to shield the light.

A photoresist composition provided by at least one embodiment of the present disclosure comprises a alkali soluble resin, a photosensitive monomer, a thermochromic pigment and a solvent, wherein the mass percentage of the alkali soluble resin is from about 10 wt % to about 30 wt %, the mass percentage of the photosensitive monomer is from about 1 wt % to about 12 wt %, the mass percentage of the thermochromic pigment is from about 5 wt % to about 20 wt %, and the mass percentage of the solvent is from about 40 wt % to about 65 wt %; and the thermochromic pigment has a darkened color upon being heated.

For example, the mass percentage of the alkali soluble resin is from about 20 wt % to about 28 wt %, the mass percentage of the photosensitive monomer is from about 6 wt % to about 10 wt %, the mass percentage of the thermochromic pigment is from about 7 wt % to about 18 wt % and the mass percentage of the solvent is from about 55 wt % to about 60 wt %.

For example, the mass percentage of the alkali soluble resin is about 22 wt %. The mass percentage of the photosensitive monomer is about 8 wt %, the mass percentage of the thermochromic pigment is about 12 wt %, and the mass percentage of the solvent is about 58 wt %.

For example, the thermochromic pigment comprises: at least one of $(NH_4)_3PO_4 \cdot 12MoO_3$, $[Cr(NH_3)_6]_4(P_2O_7)_3$, $Co(NH_3)_5Cl_3$, a crystal violet lactone containing triarylmethane and derivatives of the crystal violet lactone containing triarylmethane. For example, the thermochromic pigment has a darker color upon being heated at about 190° C. to about 230° C. In general, the prebaking temperature of the film is about 90° C. to about 120° C., and thus the thermochromic material which changes color at a temperature less than 90° C. is not suitable for the present disclosure.

For example, the discoloration mechanisms of the various thermochromic pigments mentioned above are as follows:

In a first example, the thermochromic pigment $Co(NH_3)_5Cl_3$ is in a color of violet red at room temperature; and a composition made by mixing the thermochromic pigment with the alkali soluble resin, the photosensitive monomer and the solvent is in a color of brown red; and the composition coated on a transparent glass substrate is in a color of bright red. In a case that the composition is heated, the thermochromic pigment $Co(NH_3)_5Cl_3$ releases ammonia to form $CoCl_2$ in a color of blue black. As such, the film structure formed by the composition becomes blue black to shield most of the light. For example, the equation of the reaction under the heating condition is:

For example, the color of the thermochromic pigment becomes darker upon being heated at or above 190° C. If the heating temperature is too low, the thermochromic pigment is not decomposed, and thus the color of the thermochromic pigment is unable to be changed. Furthermore, solvent residue tends to occur, and the solidification is insufficient. The residual water and oxygen impact the light-emitting layer formed subsequently. If the reaction temperature is too high, for example, greater than 230° C., which adversely affects other components and increases the production cost.

In a second example, the thermochromic pigment $(NH_4)_3PO_4 \cdot 12MoO_3$ is in a color of yellow at room temperature; and a composition made by mixing the thermochromic pigment with the alkali soluble resin, the photosensitive monomer and the solvent is in a color of light yellow; and the composition coated on a transparent glass substrate is in a color of yellowish. In a case that the composition is heated, the thermochromic pigment $(NH_4)_3PO_4 \cdot 12MoO_3$ forms ammonia, phosphoric acid and $MoO_3$ in a color of black, so that the film structure made of the composition changes its color into blue black to shield most of the light. For example, the equation for the reaction under the heating condition is:

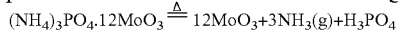

For example, the color of the thermochromic pigment becomes darker upon being heated at or above 190° C. If the heating temperature is too low, the thermochromic pigment is not decomposed, so the color of the thermochromic pigment is unable to be changed. Furthermore, solvent residue tends to occur, and solidification is insufficient. The residual water and oxygen impact the light-emitting layer formed subsequently. If the reaction temperature is too high, for example, greater than 230° C., which adversely affects other components and increases the production cost.

In a third example, the thermochromic pigment $[Cr(NH_3)_6]_4(P_2O_7)_3$ is in a color of yellow at room temperature; and a composition made by mixing the thermochromic pigment with the alkali soluble resin, the photosensitive monomer and the solvent is in a color of light yellow; and the composition coated on a transparent glass substrate is in a color of yellowish. In a case that the composition is heated, the lattice of the thermochromic pigment is changed, and thus the color becomes darker. As such the film structure made of the composition becomes dark purple to shield most of the light.

For example, the thermochromic pigment has a darker color upon being heated at 190° C. or above 190° C.

In a fourth example, the molecular formula of the thermochromic pigment is as follows:

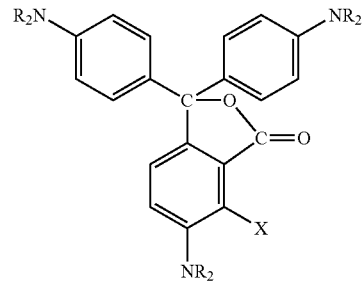

The thermochromic pigment is colorless at room temperature; and a composition made by mixing the thermochromic pigment with the alkali soluble resin, the photosensitive monomer and the solvent is in a color of light red; and the composition coated on the transparent glass substrate is in a color of bright red.

For example, the equation for the reaction under the heating condition is:

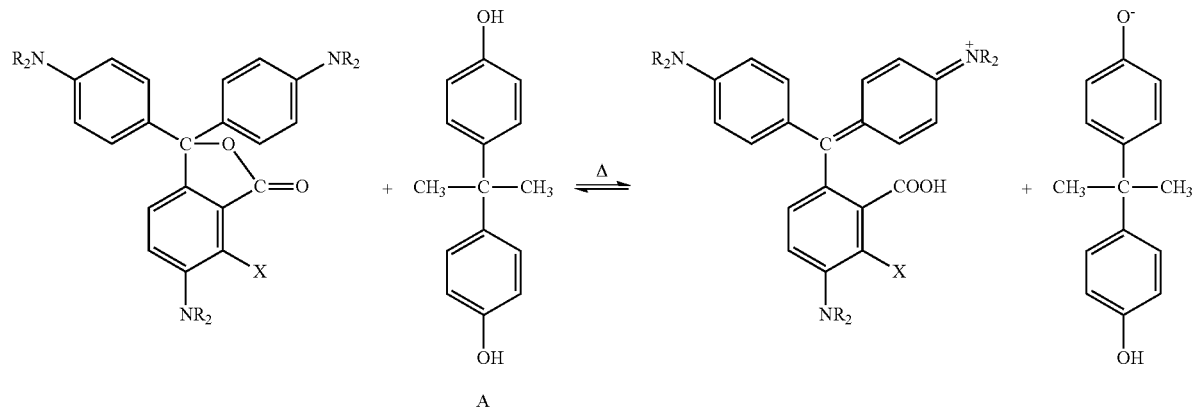

A

For example, the products after the reaction have different colors according to the substituent R chosen. For example, in a case that both the substituents R and X are H, the product appears to be purple black; in a case that the substituent R is CH₃ and the substituent X is N(CH₃)₂, the product appears to be blue purple black; in a case that the substituent R is CH₃ and the substituent X is OCH₃, the product appears to be blue black.

For example, under the heating condition, the thermochromic pigment reacts with an acidic substance (for example, bisphenol A). In addition, a small amount of acid may be added into the photoresist composition. The heating temperature ranges from about 190° C. to about 230° C. If the temperature is too low, it may result in incomplete reaction, solvent residue and insufficient solidification, which affect the light-emitting layer formed subsequently. If the temperature is too high, the solvent may volatilize, which adversely affects other components and increases the production cost.

The reaction mechanism is as follows: the carbon atom bonding to the three benzene rings changes from the sp3 hybrid state to the sp2 hybrid state, and thus the previously-separated π systems is transformed into a complete large π system, and the absorption spectra shift red, so that the compound changes from colorless to dark.

It should be noted that, the blue or purple light with a short wavelength adversely affects the performance of the thin film transistor (TFT) which acts as a switch element. In a case that the color of thermochromic pigment changes into dark purple or blue black, it can also shield most of the light for the TFT.

For example, the alkali soluble resin comprises at least one of an acrylic alkali soluble resin and a polyimide alkali soluble resin. For example, the alkali soluble resin contains hydroxyl group, which can react with photosensitive monomer and change into an alkali-insoluble resin to form a film-forming resin. With irradiation by ultraviolet light, the photosensitive group reacts to form an acid radical for dissolving in alkali solution. In addition, the alkali-soluble resin has a high developing performance and a high reaction activity, and the pattern formed by the photoresist manufactured therefrom has a high resolution.

For example, the photosensitive monomer comprises a diazonaphthoquinone-based photosensitive monomer. The diazonaphthoquinone-based photosensitive monomer has sensitivity to light, and is easy to dissolve in an alkaline developer. In a photoresist composition provided by at least one embodiment of the present disclosure, a positive photoresist is used, which has a higher resolution than a negative photoresist and improves the alignment accuracy during forming the film layer structure.

For example, a photosensitive monomer may comprise the following:

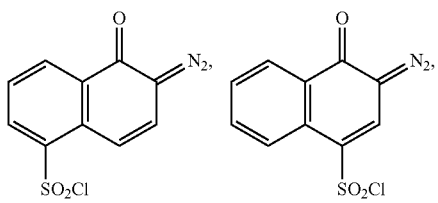

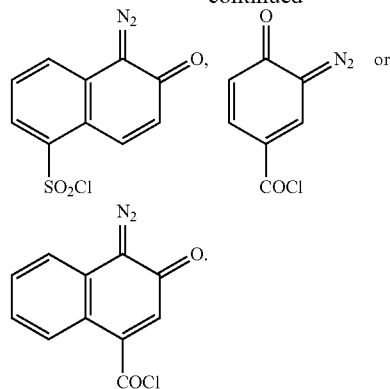

For example, in a photoresist composition provided by at least one embodiment of the present disclosure, the solvent comprises at least one of fatty alcohol, ethylene glycol monomethyl ether, ethylene glycol monoethyl ether, ethylene glycol mono propyl ether, ethylene glycol mono butyl ether, methyl ethyl ketone, methyl isobutyl ketone, γ-butyrolactone, butyldiglycol, butyldiglycol acetate, propylene glycol monomethyl ether, propylene glycol monomethyl ether acetate, cyclohexane, xylene and isopropanol.

For example, a photoresist composition provided by at least one embodiment of the present disclosure may further comprise: a fluorinated organosilicon photosensitive resin.

For example, in the photoresist composition containing the fluorinated organosilicon photosensitive resin, a mass percentage of the fluorinated organosilicon photosensitive resin is from about 5 wt % to about 10 wt %, the mass percentage of the alkali soluble resin is from about 10 wt % to about 25 wt %, the mass percentage of the photosensitive monomer is from about 1 wt % to about 10 wt %, the mass percentage of the thermochromic pigment is from about 5 wt % to about 20 wt %, and the mass percentage of the solvent is from about 40 wt % to about 63 wt %.

For example, in the photoresist composition containing the fluorinated organosilicon photosensitive resin, the mass percentage of the fluorinated organosilicon photosensitive resin is from about 6 wt % to about 8 wt %, the mass percentage of the alkali soluble resin is from about 8 wt % to about 24 wt %, the mass percentage of the photosensitive monomer is from about 3 wt % to about 8 wt %, the mass percentage of the thermochromic pigment is from about 6 wt % to about 18 wt %, and the mass percentage of the solvent is from about 45 wt % to about 60 wt %.

For example, in the photoresist composition containing the fluorinated organosilicon photosensitive resin, the mass percentage of the fluorinated organosilicon photosensitive resin is about 7 wt %, the mass percentage of the alkali soluble resin is about 15 wt %, the mass percentage of the photosensitive monomer is about 5 wt %, the mass percentage of the thermochromic pigment is about 15 wt %, and the mass percentage of the solvent is about 58 wt %.

For example, in a photoresist composition provided by at least one embodiment of the present disclosure, the fluorinated organosilicon photosensitive resin comprises at least one of a fluorinated organosilicon photosensitive resin with a silsesquioxane cage structure and a fluorinated organosilicon photosensitive resin with a linear fluorinated organosilicon structure.

For example, the fluorinated organosilicon photosensitive resin may comprise the following:

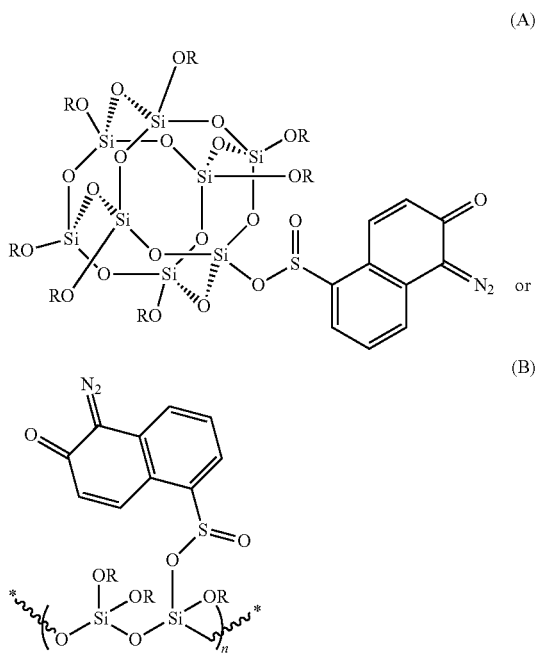

A is a fluorinated organosilicon photosensitive resin with a silsesquioxane cage structure, and B is a fluorinated organosilicon photosensitive resin with a linear fluorinated organosilicon structure. Herein, the group R is F or $CF_3$, and n is from 10 to 40.

For example, a photoresist composition provided by at least one embodiment of the present disclosure may further comprise a photoinitiator, and the photoinitiator comprises at least one of a diimidazole compound, a benzoin compound, a polynuclear quinone compound, a diphenyl ketone compound, an acetophenone compound, a triazine compound, a diazo compound, an anthrone compound, a xanthone compound, an oxime ester, an iodonium salt, and a sulfonium salt.

For example, a photoresist composition provided by at least one embodiment of the present disclosure may further comprise a dispersant, and the dispersant comprises a lignosulfonate.

For example, a photoresist composition provided by at least one embodiment of the present disclosure may further comprise one or more of a coupling agent, an antioxidant, an ultraviolet absorber and a defoamer.

For example, in a photoresist composition provided by at least one embodiment of the present disclosure, the thermochromic pigment has a darkened color upon being heated at about 190° C. to about 230° C. For example, in a case that the photoresist composition is used to manufacture the pixel definition layer, a heating temperature higher than the pre-baking temperature in the process of manufacturing the pixel definition layer and lower than the post-baking temperature allows the thermochromic pigment to be in a light color before the post-baking process, and to be in a dark color after the post-baking process. As such, the pixel definition layer film is optically transmissive during alignment, and the pixel definition layer film can have a shading effect after alignment, so that the active layer of the thin film transistor is shielded.

At least one embodiment of the present disclosure further provides an organic light-emitting diode (OLED) array substrate, and the OLED array substrate comprises a pixel definition layer made from any one of the photoresist compositions mentioned above.

For example, FIG. 1 is a schematic diagram of a sectional structure of an organic light-emitting diode (OLED) array substrate provided by an embodiment of the present disclosure. As illustrated in FIG. 1, the OLED array substrate comprises: a base substrate 101, and a driving transistor 102, a first electrode 103, a second electrode 104, a pixel definition layer 110 and an organic material function layer 105 that are arranged on the base substrate 101. The organic material functional layer 105 is located between the first electrode 103 and the second electrode 104. The driving transistor 102 comprises a gate electrode 1021, a source electrode 1022, a drain electrode 1023 and an active layer 1024. The first electrode 103 is electrically connected to the source electrode 1022 or the drain electrode 1023. The pixel definition layer 110 is arranged directly on the active layer 1024 and the pixel definition layer finally formed is dark. The pixel definition layer with a dark color can shade the active layer 1024 of the driving transistor.

The first electrode 103, the organic material function layer 105 and the second electrode 104 constitute a sandwich structure to form an organic light-emitting diode (OLED). According to requirements, the OLED may be a top-emitting type OLED, a bottom-emitting type OLED or a double sides emitting type OLED. The organic material functional layer 105 may further comprise a plurality of sublayers, such as a hole injection layer, a hole transport layer, a light-emitting layer, an electron transport layer, an electron injection layer, etc. Embodiments of the present disclosure are not limited to these specific structures.

At least one embodiment of the present disclosure further provides a manufacturing method of a photoresist composition, and the manufacturing method comprises: adding an alkali soluble resin, a photosensitive monomer and a thermochromic pigment in turn in a solvent to form the photoresist composition, wherein a mass percentage of the alkali soluble resin is from about 10 wt % to about 30 wt %, a mass percentage of the photosensitive monomer is from about 1 wt % to about 12 wt %, a mass percentage of the thermochromic pigment is from about 5 wt % to about 20 wt %, and a mass percentage of the solvent is from about 40 wt % to about 65 wt %; and the thermochromic pigment has a darkened color upon being heated.

Figure 2:
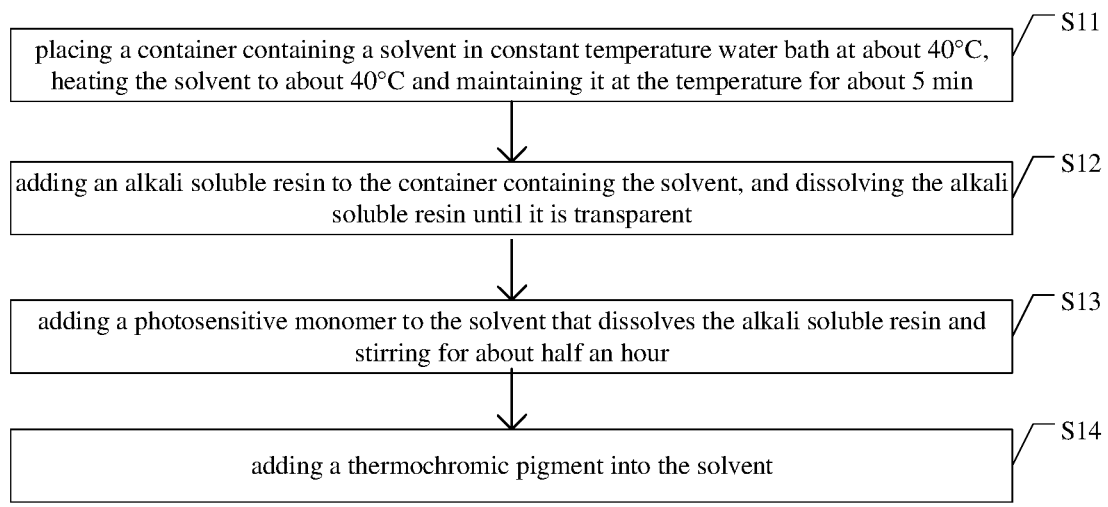
FIG. 2 is a flow diagram of a manufacturing method of a photoresist composition provided by an embodiment of the present disclosure.

For example, FIG. 2 is a flow diagram of a manufacturing method of a photoresist composition provided by an embodiment of the present disclosure, and the manufacturing method of the photoresist composition comprises:

S11: placing a container containing a solvent in constant temperature water bath at about 40° C., and heating the solvent to about 40° C. and maintaining it at the constant temperature for about 5 minutes.

For example, the solvent comprises at least one of fatty alcohol, ethylene glycol monomethyl ether, ethylene glycol monoethyl ether, ethylene glycol monopropyl ether, ethylene glycol monobutyl ether, methyl ethyl ketone, methyl isobutyl ketone, γ-butyrolactone, butyldiglycol, butyldiglycol acetate, propylene glycol monomethyl ether, propylene glycol monomethyl ether acetate, cyclohexane, xylene and isopropanol.

Step S12: adding an alkali soluble resin to the container containing the solvent, and dissolving the alkali soluble resin completely until it is transparent.

For example, the alkali soluble resin comprises at least one of an acrylic alkali soluble resin and a polyimide alkali soluble resin.

Step S13: adding a photosensitive monomer to the solvent that dissolves the alkali soluble resin and stirring for about half an hour.

For example, the photosensitive monomer comprises a diazonaphthoquinone-based photosensitive monomer, for example 2-diazo-1-naphthoquinone 5-sulfonyl chloride, 2-diazo-1-naphthoquinone 4-sulfonyl chloride, or 2-diazo-1-naphthoquinone 9-formyl chloride.

Step S14: adding a thermochromic pigment into the solvent.

For example, the thermochromic pigment comprises: at least one of $(NH_4)_3PO_4 \cdot 12MoO_3$, $[Cr(NH_3)_6]_4(P_2O_7)_3$, $Co(NH_3)_5Cl_3$, a crystal violet lactone containing triarylmethane and derivatives of the crystal violet lactone containing triarylmethane.

For example, the manufacturing method of the photoresist composition provided by at least one embodiment of the present disclosure may further comprise adding a fluorinated organosilicon photosensitive resin to the solvent before adding the thermochromic pigment. For example, the mass percentage of the fluorinated organosilicon photosensitive resin is from about 5 wt % to about 10 wt %, the mass percentage of the alkali soluble resin is from about 10 wt % to about 25 wt %, the mass percentage of the photosensitive monomer is from about 1 wt % to about 10 wt %, the mass percentage of the thermochromic pigment is from about 5 wt % to about 20 wt %, and the mass percentage of the solvent is from about 40 wt % to about 63 wt %.

Figure 3:
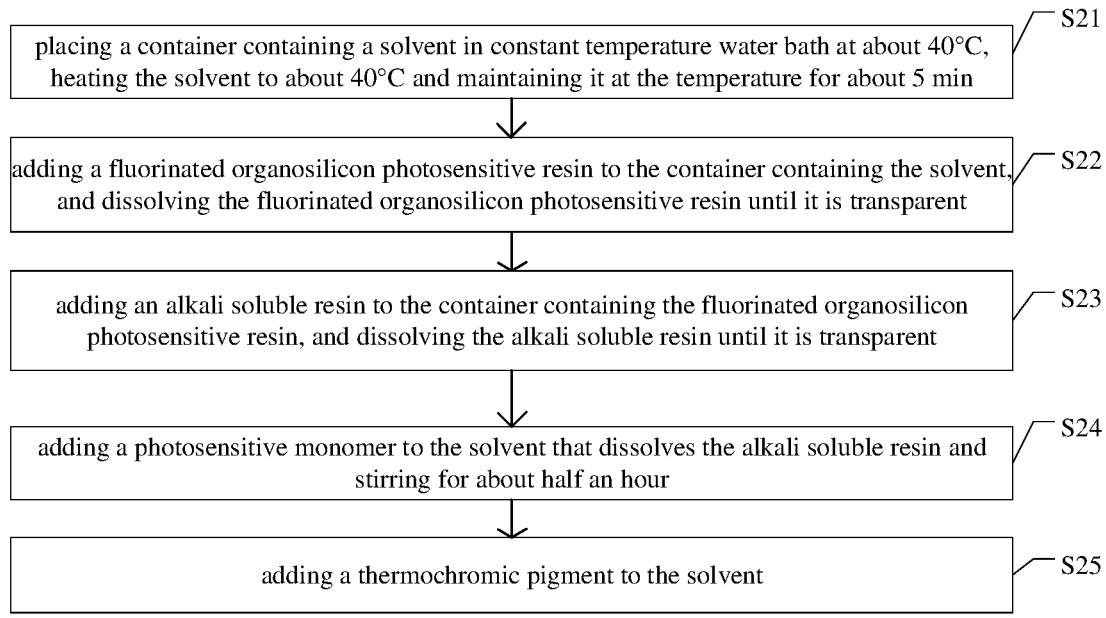
FIG. 3 is a flow diagram of another manufacturing method of a photoresist composition provided by an embodiment of the present disclosure.

For example, FIG. 3 is a flow diagram of another manufacturing method of a photoresist composition provided by an embodiment of the present disclosure, and the manufacturing method of the photoresist composition comprises:

Step S21: placing a container containing a solvent in constant temperature water bath at about 40° C., and heating the solvent to about 40° C. and maintaining it at the constant temperature for about 5 minutes.

For example, the solvent comprises at least one of fatty alcohol, ethylene glycol monomethyl ether, ethylene glycol monoethyl ether, ethylene glycol monopropyl ether, ethylene glycol monobutyl ether, methyl ethyl ketone, methyl isobutyl ketone, γ-butyrolactone, butyldiglycol, butyldiglycol acetate, propylene glycol monomethyl ether, propylene glycol monomethyl ether acetate, cyclohexane, xylene and isopropanol.

Step S22: adding a fluorinated organosilicon photosensitive resin to the container containing the solvent, and dissolving the fluorinated organosilicon photosensitive resin until it is transparent.

For example, the fluorinated organosilicon photosensitive resin may comprise the following:

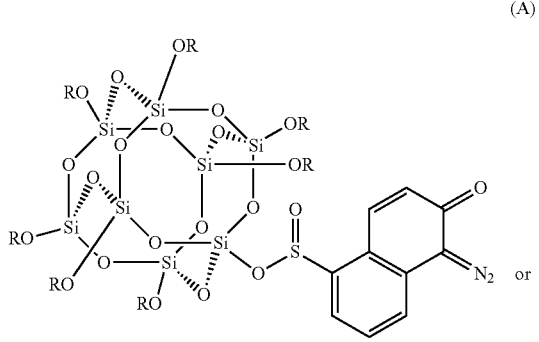

(A)

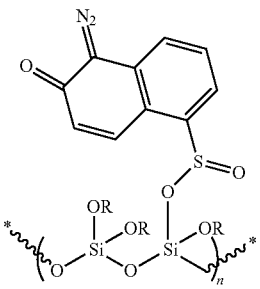

(B)

A is a fluorinated organosilicon photosensitive resin with a silsesquioxane cage structure, and B is a fluorinated organosilicon photosensitive resin with a linear fluorinated organosilicon structure. Herein, the group R is F or $CF_3$, and n is from 10 to 40.

Step S23: adding an alkali soluble resin to the container containing the fluorinated organosilicon photosensitive resin, and dissolving the alkali soluble resin until it is transparent.

For example, the alkali soluble resin comprises at least one of an acrylic alkali soluble resin and a polyimide alkali soluble resin.

Step S24: adding a photosensitive monomer to the solvent that dissolves the alkali soluble resin and stirring for half an hour.

For example, the photosensitive monomer comprises a diazonaphthoquinone-based photosensitive monomer, such as 2-diazo-1-naphthoquinone 5-sulfonyl chloride, 2-diazo-1-naphthoquinone 4-sulfonyl chloride, or 2-diazo-1-naphthoquinone 9-formyl chloride.

Step S25: adding a thermochromic pigment to the solvent.

For example, the thermochromic pigment comprises at least one of $(NH_4)_3PO_4 \cdot 12MoO_3$, $[Cr(NH_3)_6]_4(P_2O_7)_3$, $Co(NH_3)_5Cl_3$, a crystal violet lactone containing triarylmethane and derivatives of the crystal violet lactone containing triarylmethane.

For instance, in the examples illustrated in FIG. 2 and FIG. 3, a photoinitiator, a dispersant, a coupling agent, an antioxidant, an ultraviolet absorber and/or a defoamer may further be added to the solvent in which the thermochromic pigment has been added.

For example, the photoinitiator comprises at least one of a diimidazole compound, a benzoin compound, a polynuclear quinone compound, a diphenyl ketone compound, an acetophenone compound, a triazine compound, a diazo compound, an anthrone compound, a xanthone compound, an oxime ester, an iodonium salt, and a sulfonium salt.

For example, the dispersant comprises a lignosulfonate.

For example, the fluorinated organosilicon photosensitive resin added can reduce the surface energy of the film structure formed by the photoresist composition. Silicon, fluorine and other components with lower surface free energy in the fluorinated organosilicon photosensitive resin are enriched on the surface to minimize the surface free energy.

At least one embodiment of the present disclosure further provides a manufacturing method of an organic light-emitting diode (OLED) array substrate, and the manufacturing method comprises: providing a base substrate; forming a film of any one of the above mentioned photoresist compositions on the base substrate; patterning the film of the photoresist composition to form a pixel definition layer pattern; and heating the pixel definition layer pattern to darken its color.

Figure 4:
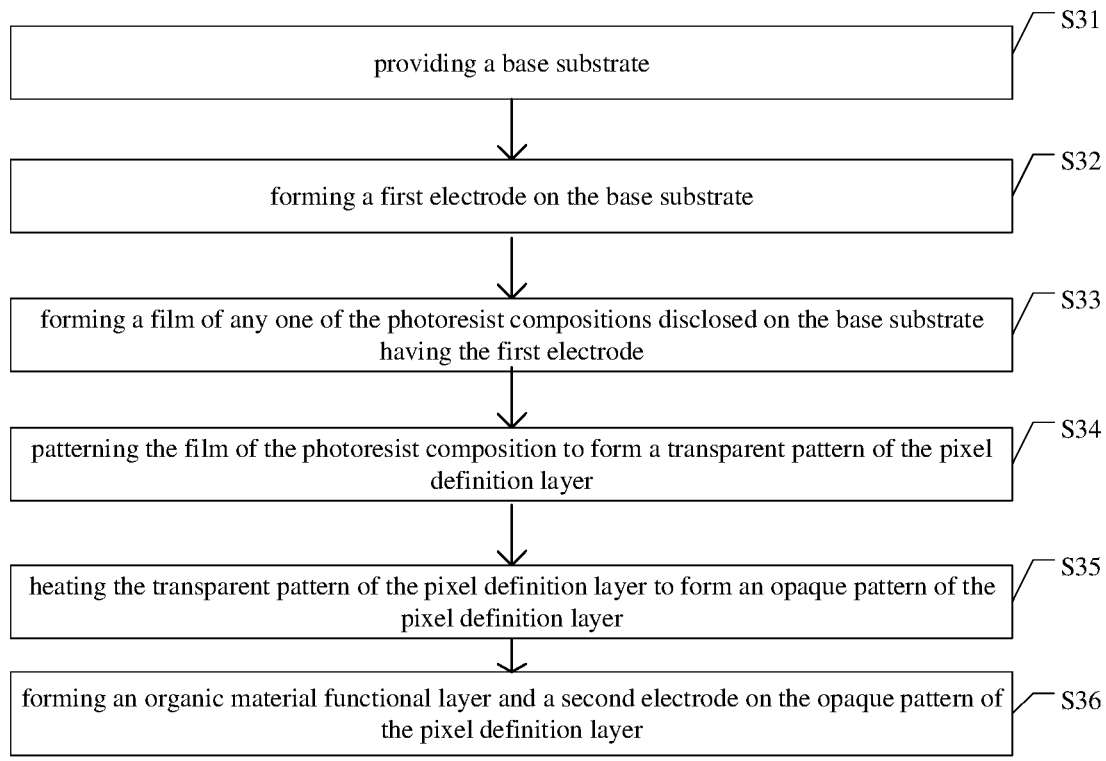
FIG. 4 is a flow diagram of a manufacturing method of an organic light-emitting diode (OLED) array substrate provided by an embodiment of the present disclosure.

For example, FIG. 4 is a flow diagram of a manufacturing method of an organic light-emitting diode (OLED) array substrate provided by an embodiment of the present disclosure. The manufacturing method comprises:

Step S31: providing a base substrate;

For example, the base substrate is cleaned by a standard method. The base substrate may be a glass substrate, a quartz substrate, or a plastic substrate, etc.

Step S32: forming a first electrode on the base substrate.

For example, the process of forming the first electrode may comprise depositing a conductive film by a magnetron sputtering method. The material of the conductive film may comprise transparent conductive oxides such as indium tin oxide (ITO), indium zinc oxide (IZO), indium gallium oxide (IGO), gallium zinc oxide (GZO), zinc oxide (ZnO), indium oxide ($In_2O_3$), and alumina zinc oxide (AZO); and metal conductive materials such as copper (Cu), chromium (Cr), molybdenum (Mo), gold (Au), silver (Ag), and platinum (Pt), or alloys thereof, such as copper chromium alloy (CuCr) or chromium molybdenum alloy (CrMo). Then a common photoresist is applied on the deposited conductive film, and a first electrode pattern is formed after the exposure and development processes. The first electrode has a thickness of from about 100 nm to about 200 nm.

Step S33: forming a film of any one of the above mentioned photoresist compositions on the base substrate having the first electrode.

For example, a spin coating method or a printing method is used to form the film of the photoresist composition. The film of the photoresist composition is transparent (for example, the transmittance is greater than 50%), which is convenient for alignment in the process of forming a pixel definition layer pattern.

Step S34: patterning the film of the photoresist composition to form a pixel definition layer pattern.

For example, before patterning the film of the photoresist composition, the method may further comprise a prebaking process. The temperature of the prebaking process is from about 90° C. to about 120° C., and the period of the prebaking process is about 1.5 minutes (min) to 3 minutes (min). Patterning the film of the photoresist composition after the prebaking process comprises aligning by a mask plate, and then exposing and developing the film of the photoresist composition to form a transparent pattern of the pixel definition layer (for example, the transmittance is greater than 50%).

Step S35: heating the transparent pattern of the pixel definition layer to form an opaque pattern of the pixel definition layer (for example, the transmittance is less than 50%).

For example, the temperature range for heating the transparent pattern of the pixel definition layer is from about 190° C. to about 230° C., and the heating time is about 30 minutes (min) to about 60 minutes (min). For example, the temperature for heating the transparent pattern of the pixel definition layer is about 190° C., and the heating time is about 45 minutes (min). In this way, the color of the pixel definition layer is darkened, for example, the color is changed into blue black, blue purple or black to form an opaque pixel definition layer (for example, the transmittance is less than 50%). The opaque pixel definition layer shields the active layer of the thin film transistor. The thickness of the pixel definition layer is from about 1 μm to about 1.5 μm, for example, is about 1 μm, 1.2 μm, 1.4 μm or 1.5 μm.

Step S36: forming an organic material functional layer and a second electrode on the opaque pattern of the pixel definition layer.

For example, the organic material functional layer comprises: an organic light-emitting layer, a hole transmission layer, a hole injection layer, an electron transport layer, and an electron injection layer. For example, the thickness of the organic light-emitting layer is about 200 nm to about 300 nm, for example, the thickness of the organic light-emitting layer is about 200 nm, 220 nm, 250 nm, or 300 nm. For example, the organic light-emitting layer may be formed by an evaporation process or an inkjet printing process.

For example, the material of the second electrode comprises metals such as silver, magnesium, aluminum and lithium, or alloys such as magnesium aluminum alloy (MgAl) and lithium aluminum alloy (LiAl). The thickness of the second electrodes is about 500 nm to about 600 nm, for example, the thickness of the second electrodes is about 500 nm, 520 nm, 550 nm, or 600 nm. The second electrode may be formed by an evaporation method.

The manufacturing process of the organic light-emitting diode (OLED) array substrate may further comprise forming a thin film transistor on the base substrate, and the thin film transistor is a top gate type thin film transistor, a bottom gate type thin film transistor or a double gate type thin film transistor. The manufacturing process of the thin film transistor refers to the conventional manufacturing process, which is omitted here.

In the above examples, the first electrode is formed before the pixel definition layer is formed. In other examples, the first electrode may be formed after the pixel definition layer is formed.

The transmittance of the organic light-emitting diode (OLED) array substrate made according to the above method is analyzed, and the relationship between the amount of the thermochromic pigment and the transmittance of the white light is studied. The thermochromic pigment is $Co(NH_3)_5Cl_3$ in the following examples, and the pixel definition layer of the organic light-emitting diode (OLED) array substrate is formed by the photoresist composition in the following examples.

Example 1 the mass percentage of the fluorinated organosilicon photosensitive resin is about 7 wt %, the mass percentage of the alkali soluble resin is about 15 wt %, the mass percentage of the photosensitive monomer is about 5 wt %, the mass percentage of the thermochromic pigment is 0 wt %, the mass percentage of the solvent is about 58 wt %, the mass percentage of the photoinitiator is about 10 wt %, the mass percentage of the dispersant is about 3 wt %, and the mass percentage of the antioxidant is about 2 wt %.

Example 2 the mass percentage of the fluorinated organosilicon photosensitive resin is about 7 wt %, the mass percentage of the alkali soluble resin is about 15 wt %, the mass percentage of the photosensitive monomer is about 5 wt %, the mass percentage of the thermochromic pigment is about 2 wt %, the mass percentage of the solvent is about 58 wt %, the mass percentage of the photoinitiator is about 8 wt %, the mass percentage of the dispersant is about 3 wt %, and the mass percentage of the antioxidant is about 2 wt %.

Example 3 the mass percentage of the fluorinated organosilicon photosensitive resin is about 7 wt %, the mass percentage of the alkali soluble resin is about 15 wt %, the mass percentage of the photosensitive monomer is about 5 wt %, the mass percentage of the thermochromic pigment is about 4 wt %, the mass percentage of the solvent is about 58 wt %, the mass percentage of the photoinitiator is about 7 wt %, the mass percentage of the dispersant is about 3 wt %, and the mass percentage of the antioxidant is about 1 wt %.

Example 4 the mass percentage of the fluorinated organosilicon photosensitive resin is about 7 wt %, the mass percentage of the alkali soluble resin is about 15 wt %, the mass percentage of the photosensitive monomer is about 5 wt %, the mass percentage of the thermochromic pigment is about 6 wt %, the mass percentage of the solvent is about 56 wt %, the mass percentage of the photoinitiator is about 7 wt %, the mass percentage of the dispersant is about 3 wt %, and the mass percentage of the antioxidant is about 1 wt %.

Example 5 the mass percentage of the fluorinated organosilicon photosensitive resin is about 7 wt %, the mass percentage of the alkali soluble resin is about 15 wt %, the mass percentage of the photosensitive monomer is about 5 wt %, the mass percentage of the thermochromic pigment is about 8 wt %, the mass percentage of the solvent is about 54 wt %, the mass percentage of the photoinitiator is about 7 wt %, the mass percentage of the dispersant is about 3 wt %, and the mass percentage of the antioxidant is about 1 wt %.

Figure 5:
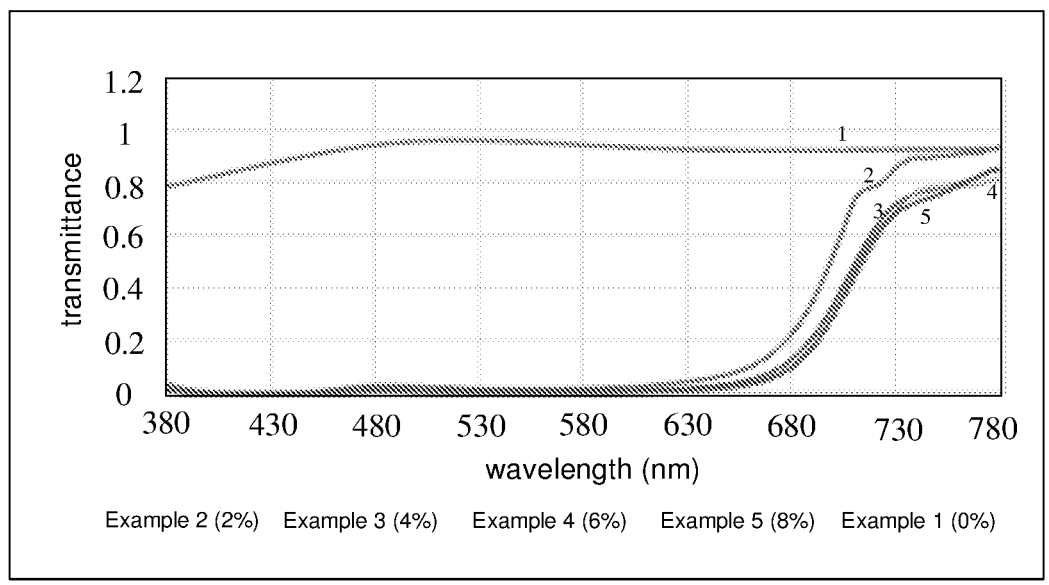
FIG. 5 is a relationship diagram between the added amount of the thermochromic pigment and the transmittance of white light provided by an embodiment of the present disclosure.

FIG. 5 is a relationship diagram between the amount of thermochromic pigment and the transmittance of white light according to an embodiment of the present disclosure. It is seen from FIG. 5, in a case that the mass percentage of the thermochromic pigment is 0 wt %, the transmittance of the light with a wavelength of about 380 nm to 630 nm is from about 80% to about 95%. In a case that the mass percentage of the thermochromic pigment is about 2 wt %, 4 wt %, 6 wt % and 8 wt %, the transmittance of the light with a wavelength of about 380 nm to 630 nm is basically close to 0. The pixel definition layer made from the photoresist composition in any one of Examples 2-5 blocks most of the light with a wavelength of about 380 nm to 630 nm, that is, blocks blue light and violet light with a short wavelength. The light with a short wavelength is prevented from affecting the performance of the thin film transistor (TFT) adversely. That is, in a case that the color of the thermochromic pigment changes into purple black or blue black, it plays a good role of shading for the TFT.

At least one embodiment of the present disclosure provides a photoresist composition, a manufacturing method of the photoresist composition, an organic light-emitting diode (OLED) array substrate and a manufacturing method of the organic light-emitting diode (OLED) array substrate, which have at least one of the following beneficial effects:

(1) At least one embodiment of the present disclosure provides a photoresist composition for forming a pixel definition layer. Before performing a post-baking process on a pixel definition layer film, the pixel definition layer film allows the light to pass through, so as to facilitate the alignment for forming a pattern of the pixel definition layer. After the pattern of the pixel definition layer is formed, the thermochromic pigment in the pixel definition layer undergoes an irreversible color change in the subsequent post-baking process, and the color of the pixel definition layer is darkened to achieve the shading effect.

(2) At least one embodiment of the present disclosure provides a photoresist composition using a positive photoresist. Compared with a negative photoresist, the positive photoresist has a higher resolution, which improves the alignment accuracy.

(3) The fluorinated organosilicon photosensitive resin included in a photoresist composition provided by at least one embodiment of the present disclosure reduces the surface energy of the pixel definition layer.

Please note that:

(1) The drawings of the present disclosure are only related to the structures mentioned in the embodiments of the present disclosure, and other structures can be further obtained by general designs;

(2) For the sake of clarity, sizes of layers or regions in the drawings for describing the embodiments of the present disclosure are not drawn according to an actual scale, but may be exaggerated or diminished. It will be understood that when an element such as a layer, a film, a region or a substrate is referred to as being "on" or "under", the element may be directly on or under another element, or there may be an element(s) therebetween; and (3) The embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. A photoresist composition, comprising an alkali soluble resin, a photosensitive monomer, a thermochromic pigment and a solvent, wherein:
   a mass percentage of the alkali soluble resin is from about 10 wt % to about 30 wt %;
   a mass percentage of the photosensitive monomer is from about 1 wt % to about 12 wt %;
   a mass percentage of the thermochromic pigment is from about 5 wt % to about 20 wt %;
   a mass percentage of the solvent is from about 40 wt % to about 65 wt %; and
   the thermochromic pigment is configured to make the photoresist composition transmit light before heating, and make the color of the photoresist composition blue black, purple black or blue purple black after heating to shield light.

2. The photoresist composition according to claim 1, further comprising a fluorinated organosilicon photosensitive resin, wherein:
   a mass percentage of the fluorinated organosilicon photosensitive resin is from about 5 wt % to about 10 wt %;
   the mass percentage of the alkali soluble resin is from about 10 wt % to about 25 wt %;
   the mass percentage of the photosensitive monomer is from about 1 wt % to about 10 wt %;
   the mass percentage of the thermochromic pigment is from about 5 wt % to about 20 wt %; and
   the mass percentage of the solvent is from about 40 wt % to about 63 wt %.

3. The photoresist composition according to claim 2, wherein the fluorinated organosilicon photosensitive resin comprises at least one of a fluorinated organosilicon photosensitive resin with a silsesquioxane cage structure and a fluorinated organosilicon photosensitive resin with a linear fluorinated organosilicon structure.

4. The photoresist composition according to claim 2, wherein the alkali soluble resin comprises at least one of an acrylic alkali soluble resin and a polyimide alkali soluble resin.

5. The photoresist composition according to claim 2, wherein the photosensitive monomer comprises a diazonaphthoquinone-based photosensitive monomer.

6. The photoresist composition according to claim 2, wherein the solvent comprises at least one of fatty alcohol, ethylene glycol monomethyl ether, ethylene glycol monoethyl ether, ethylene glycol monopropyl ether, ethylene glycol monobutyl ether, methyl ethyl ketone, methyl isobutyl ketone, γ-butyrolactone, butyldiglycol, butyldiglycol acetate, propylene glycol monomethyl ether, propylene glycol monomethyl ether acetate, cyclohexane, xylene and isopropanol.

7. The photoresist composition according to claim 2, further comprising a photoinitiator, wherein
the photoinitiator comprises at least one of a diimidazole compound, a benzoin compound, a polynuclear quinone compound, a diphenyl ketone compound, an acetophenone compound, a triazine compound, a diazo compound, an anthrone compound, a xanthone compound, an oxime ester, an iodonium salt, and a sulfonium salt.

8. The photoresist composition according to claim 2, further comprising a dispersant, wherein the dispersant comprises a lignosulfonate.

9. The photoresist composition according to claim 1, wherein the thermochromic pigment comprises at least one of $(NH_4)_3PO_4 \cdot 12MoO_3$, $[Cr(NH_3)_6]_4(P_2O_7)_3$, $Co(NH_3)_5Cl_3$, a crystal violet lactone containing triarylmethane, and derivatives of the crystal violet lactone containing triarylmethane.

10. The photoresist composition according to claim 9, wherein the thermochromic pigment has a darkened color upon being heated at about 190° C. to about 230° C.

11. The photoresist composition according to claim 1, wherein the alkali soluble resin comprises at least one of an acrylic alkali soluble resin and a polyimide alkali soluble resin.

12. The photoresist composition according to claim 1, wherein the photosensitive monomer comprises a diazonaphthoquinone-based photosensitive monomer.

13. The photoresist composition according to claim 1, wherein the solvent comprises at least one of fatty alcohol, ethylene glycol monomethyl ether, ethylene glycol monoethyl ether, ethylene glycol monopropyl ether, ethylene glycol monobutyl ether, methyl ethyl ketone, methyl isobutyl ketone, γ-butyrolactone, butyldiglycol, butyldiglycol acetate, propylene glycol monomethyl ether, propylene glycol monomethyl ether acetate, cyclohexane, xylene and isopropanol.

14. The photoresist composition according to claim 1, further comprising a photoinitiator, wherein
the photoinitiator comprises at least one of a diimidazole compound, a benzoin compound, a polynuclear quinone compound, a diphenyl ketone compound, an acetophenone compound, a triazine compound, a diazo compound, an anthrone compound, a xanthone compound, an oxime ester, an iodonium salt, and a sulfonium salt.

15. The photoresist composition according to claim 1, further comprising a dispersant, wherein the dispersant comprises a lignosulfonate.

16. The photoresist composition according to claim 1, further comprising at least one of a coupling agent, an antioxidant, an ultraviolet absorber and a defoamer.

17. An organic light-emitting diode (OLED) array substrate, comprising a pixel definition layer made from the photoresist composition according to claim 1.

18. A manufacturing method of a photoresist composition, comprising:
adding an alkali soluble resin, a photosensitive monomer and a thermochromic pigment in turn in a solvent to form the photoresist composition,
wherein a mass percentage of the alkali soluble resin is from about 10 wt % to about 30 wt %,
a mass percentage of the photosensitive monomer is from about 1 wt % to about 12 wt %,
a mass percentage of the thermochromic pigment is from about 5 wt % to about 20 wt %, and
a mass percentage of the solvent is from about 40 wt % to about 65 wt %; and
before heating, the photoresist composition has light transmittance, and after heating, the color of the photoresist composition becomes blue black, purple black or blue purple black to have light shielding.

19. The manufacturing method according to claim 18, further comprising:
adding a fluorinated organosilicon photosensitive resin to the solvent before adding the thermochromic pigment,
wherein a mass percentage of the fluorinated organosilicon photosensitive resin is from about 5 wt % to about 10 wt %,
the mass percentage of the alkali soluble resin is from about 10 wt % to about 25 wt %,
the mass percentage of the photosensitive monomer is from about 1 wt % to about 10 wt %,
the mass percentage of the thermochromic pigment is from about 5 wt % to about 20 wt %, and
the mass percentage of the solvent is from about 40 wt % to about 63 wt %.

20. A manufacturing method of an organic light-emitting diode (OLED) array substrate, comprising:
providing a base substrate;
forming a film of the photoresist composition according to claim 1 on the base substrate;
patterning the film of the photoresist composition to form a pixel definition layer pattern; and
heating the pixel definition layer pattern to darken its color.

* * * * *